United States Patent [19]

Mayama et al.

[11] Patent Number: 5,929,565
[45] Date of Patent: Jul. 27, 1999

[54] SHORT ARC DISCHARGE LAMP HAVING ANODE WITH TUNGSTEN COATING THEREON

[75] Inventors: Shouichi Mayama; Susumu Nakanishi, both of Himeji, Japan

[73] Assignee: Ushiodenki Kabushiki Kaisha, Tokyo, Japan

[21] Appl. No.: 08/806,515

[22] Filed: Feb. 24, 1997

[30] Foreign Application Priority Data

Feb. 23, 1996 [JP] Japan .................................. 8-060357

[51] Int. Cl.$^6$ ........................................................ H01J 17/04
[52] U.S. Cl. .......................... 313/631; 313/632; 313/633; 313/643
[58] Field of Search ...................... 313/574, 631, 313/632, 633, 643, 355, 491, 346 R

[56] References Cited

U.S. PATENT DOCUMENTS

| | | |
|---|---|---|
| 3,248,591 | 4/1966 | Arndt . |
| 3,723,783 | 3/1973 | Beese et al. ............................. 313/32 |
| 3,911,309 | 10/1975 | Kummel et al. ..................... 313/346 R |

FOREIGN PATENT DOCUMENTS

WO 96/02062  1/1996  WIPO .

OTHER PUBLICATIONS

Patent Abstracts of Japan, vol. 014, No. 584, (E–1018), Dec. 27, 1990 & JP 02 256150 A (Ushio Inc.), Oct. 16, 1990, *Absract*.

Patent Abstracts of Japn, vol. 015, No. 090, (E–1040), Mar. 5, 1991 & JP 02 304857 A (Ushio Inc), Dec. 18, 1990, *Abstract*.

*Primary Examiner*—Vip Patel
*Attorney, Agent, or Firm*—Sixbey, Friedman, Leedom & Ferguson; David S. Safran

[57] ABSTRACT

A discharge lamp of the short arc type including an arc tube and an anode and cathode within the arc tube positioned opposite one another. The present invention includes an anode arrangement in which the temperature increase of the anode in luminous operation is suppressed as much as possible, in which blackening of the inside wall of the arc tube as a result of premature vaporization of the anode material is suppressed, and in which the durability of the above described lamp is prolonged. Specifically, the outer surface of the anode includes sintered layers of fine-particle tungsten adjacent the tip of the anode. In this way, the effective surface area of the anode is increased, the heat radiation from the anode is accelerated, and the premature vaporization of the anode material is suppressed.

2 Claims, 4 Drawing Sheets

SHORT ARC DISCHARGE LAMP HAVING ANODE WITH TUNGSTEN COATING THEREON

BACKGROUND OF THE INVENTION

1. Field of the Invention

The invention relates to a discharge lamp of the short arc type.

2. Description of the Prior Art

For a photolithography process in semiconductor manufacture, for example, among discharge lamps of the short arc type, high pressure mercury vapor lamps of the short arc type are used. Recently there has been a demand for narrowing emission distribution spectral bands of ultraviolet rays which involve mainly 436 nm (hereinafter called the "g-line") or 365 nm (hereinafter called the "i-line") in order to increase image resolution upon exposure with ultraviolet rays.

To narrow the spectral width of the g-line or i-line, it is a good idea to reduce the mercury pressure within the arc tube of a mercury vapor lamp of the short arc type. This means that, in the case of high mercury pressure, the pressure expansion of the i-line spectrum increases, by which the spectral width of the g-line or the i-line expands. If, on the other hand, the mercury pressure is low, the pressure expansion of the i-line spectrum diminishes, by which narrowing of the spectral width of the g-line or the i-line is enabled. If, however, the mercury pressure within the arc tube is reduced, the electrical resistance between the electrodes drops, by which the lamp voltage decreases during luminous operation. As a result thereof, the lamp current in the case of the same lamp output power is multiplied.

If the lamp current is multiplied in this way, the anode temperature increases even more as a result of collision of the multiplied electron current. Furthermore, the effect is to suppress the vaporization of the anode material by the above described mercury because the mercury pressure within the arc tube is low. Consequently, the disadvantages were premature vaporization of the anode, blackening of the inside wall of the arc tube and shortening of the service life.

For example, Japanese patent disclosure document HEI 2-256150 discloses a process for suppressing this vaporization of the anode part. Here, it is disclosed that the anode surface outside its tip includes porous layers consisting of a mixture of tantalum carbide and tungsten in order to reduce the anode temperature during luminous operation of the lamp. Further, the disclosure discusses increasing the effective surface area of the anode, multiplying the radiation from the above described surface, and, thus, reducing the anode temperature, and the like.

Here the tantalum carbide due to its higher radiation capacity than tungsten is therefore also used to increase the radiation effect. But tantalum carbide has the property of decomposing by reduction in an area with a high temperature in the vicinity of the electrode tips. This means that for this reason the area in which the mixed layers could be formed was limited, although actually the mixed layers of the tantalum carbide and tungsten should be formed into near the above described tip to cool the temperature of the anode tip which has the highest temperature.

On the other hand, there is a demand for increasing even more the degree to which the illumination intensity of the g-line or the i-line is maintained in the above described lithography process. Here there is increased demand for preventing blackening of the tube wall of the discharge lamp of the short arc type compared to what was conventionally the case.

The disadvantage of vaporizing the electrode material resulting from temperature increases of the electrode, however, is also present in other discharge lamps of the short arc type, for example, in a xenon lamp or the like.

SUMMARY OF THE INVENTION

Therefore, a primary object of the invention is to devise a discharge lamp of the short arc type in which the anode temperature is reduced more than in a conventional discharge lamp of the short arc type, in which premature vaporization of the anode part is suppressed and in which the degree to which irradiance is maintained is kept high.

Another object of the invention is to simplify surface treatment even more for purposes of radiation of the anode than was conventionally the case.

The above described objects are achieved according to the invention by forming, in a discharge lamp of the short arc type in which within the arc tube an anode and cathode are located opposite one another and emission substances are encapsulated, sintered layers of fine-particle tungsten on the outside surface of the above described anode outside the vicinity of its tip are formed.

The above described objects are achieved according to the invention, especially in a lithography process in the manufacture of semiconductor components and the like, by utilizing an anode and cathode opposite one another in a discharge lamp of the short arc type within the arc tube, by at least one of the rare gases Xe, Ar, Kr or Ne being encapsulated within the above described arc tube in addition to the Hg, and by sintered layers of fine-particle tungsten being formed on the outside surface of the above described anode outside the vicinity of its tip.

The above described objects are furthermore achieved according to the invention by the condition $0.1\,D \leq x < 0.45\,D$ being satisfied in a discharge lamp of the short arc type, where the distance between the tip of the above described anode and the boundary of the area in which the sintered layers of the fine-particle tungsten are formed is labelled x, and where the diameter of the body of the above described anode is labelled D.

In the discharge lamp of the short arc type according to the invention, by providing sintered layers of fine-particle tungsten formed on the outside surface of the anode near its tip fine concave-convex areas are formed on the anode surface, the effective surface area of the anode is increased, the temperature increase of the anode tip in luminous operation is suppressed, premature vaporization of the anode part is prevented, and blackening of the inside wall of the arc tube is suppressed.

These and further objects, features and advantages of the present invention will become apparent from the following description when taken in connection with the accompanying drawings which, for purposes of illustrations only, show several embodiments in accordance with the present invention.

DETAILED DESCRIPTION OF THE PRESENT INVENTION

Figure 1:
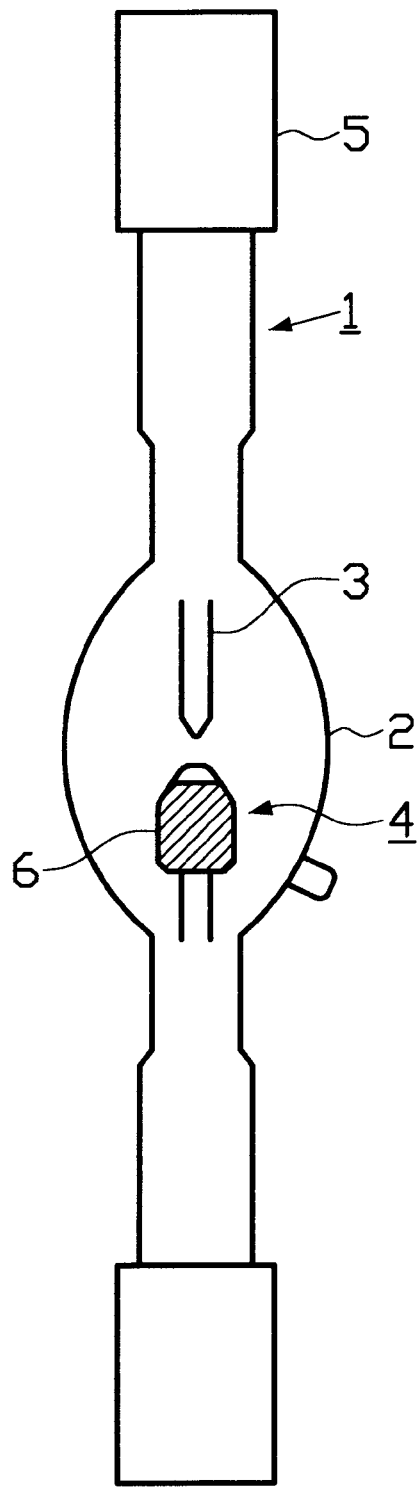
FIG. 1 shows an overall view of a discharge lamp of the short arc type according to the invention.

FIG. 1 is a schematic of discharge lamp of the short arc type 1 which is used for the invention. Here in a transparent arc tube 2 there are a cathode 3 and anode 4 opposite one another. Reference number 5 is a base. Sintered layers 6 of fine-particle tungsten are formed on the outside surface of anode 4 outside of its tip. Anode 4 consists of a material with a high melting point, such as tungsten, molybdenum, or the like. At least one metal, such as Hg, Cd, Zn or the like, at least one rare gas such as Xe, Ar, Kr, Ne or the like, and at least one metal halide or the like are suitably encapsulated in arc tube 2 as emission substances according to the required radiant light from the above described discharge lamp of the short arc type.

In the following a specific embodiment of the invention of a high pressure mercury vapor lamp of the short arc type is described which is used as a light source for lithography in a process of producing semiconductor components. The outside layer of the above described high pressure mercury vapor lamp of the short arc type is identical to FIG. 1. In arc tube 2 consisting of quartz glass, Hg and rare gas are encapsulated as the emission substances. Anode 4 consists of tungsten.

Figure 2:
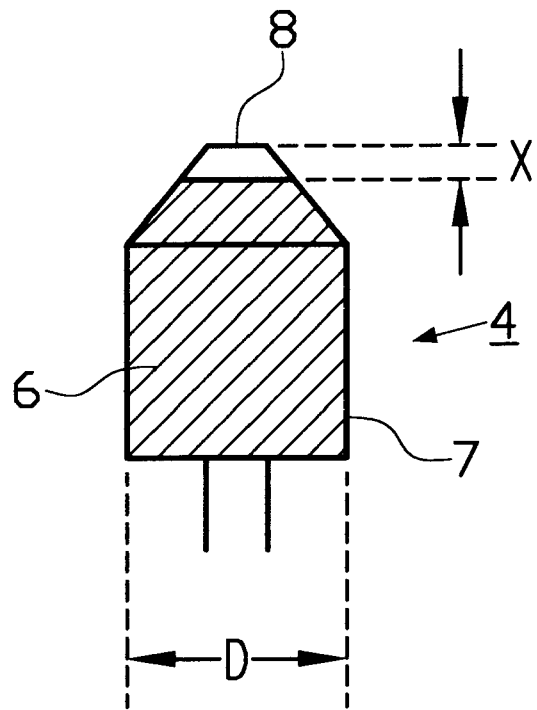
FIG. 2 shows an enlarged representation of the anode of the discharge lamp of the short arc type according to the invention.
Figure 3:
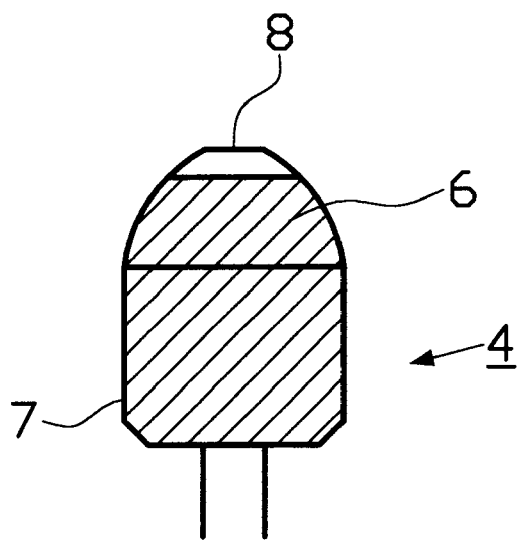
FIG. 3 shows a schematic of another embodiment of the anode of the discharge lamp of the short arc type according to the invention.

FIG. 2 shows anode 4 in an enlarged view. In a predetermined surface area of anode 4 sintered layers 6 of fine-particle tungsten are formed. FIG. 3 schematically shows another embodiment of anode 4 in the discharge lamp according to the invention in which tip part 8 of the anode is round. In FIG. 2 the diameter of body 7 of anode 4 is labelled D (mm) and the distance between tip part 8 of above described anode 4 and the boundary to the area in which sintered layers 6 of fine-particle tungsten are present is labeled x (mm). Here the expression "fine-particle tungsten" is defined as particulate tungsten with a grain size of roughly 0.1 to 100 microns. By forming convex-concave areas as sintered layers 6 on the outside surface of anode 4, the function of increasing the effective surface area of anode 4 is obtained.

In the following, the formation of sintered layers 6 of fine-particle tungsten on the surface of anode 4 is described.

Specifically, fine tungsten particles with an average grain size of 3 microns (purity 99.9%) are mixed in a solvent of nitrocellulose and butyl acetate. A solution in which these fine tungsten particles are dispersed is applied using a brush or the like proceeding from the predetermined surface area of anode 4, i.e., preceding from an area spaced apart from tip part 8 of the anode with a distance x (0.1 D≦x≦0.45 D). After the surface subjected to application had been dried, sintering treatment was done in which the anode was kept for two hours in a vacuum atmosphere of $2 \times 10^{-4}$ Pa at a temperature of 2200° C. The thickness of sintered layer 6 of the fine-particle tungsten is not particularly limited, but is, for example, roughly 1 to 10 microns.

Figure 4:
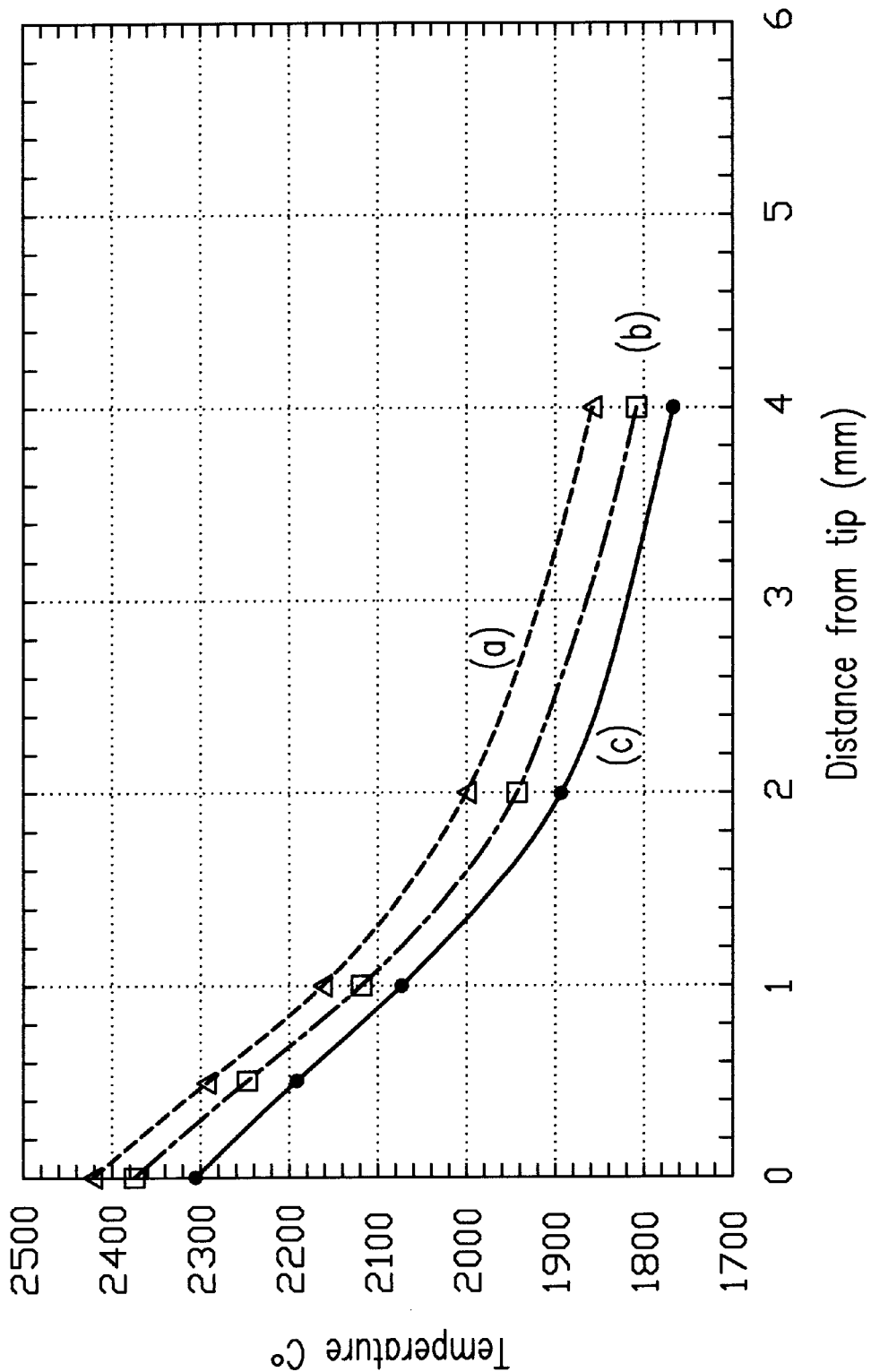
FIG. 4 shows a schematic which reproduces the result of measurements in which the anode temperature in luminous operation of a high pressure mercury vapor lamp of the short arc type used for the invention was compared to the anode temperature in luminous operation of a conventional high pressure mercury vapor lamp of the short arc type.

FIG. 4 is a schematic which reproduces the result of measurements in which the anode temperature in luminous operation of the discharge lamp of the short arc type according to the invention was compared to the anode temperature in luminous operation of a conventional discharge lamp of the short arc type. In this case, the anode was not subjected to treatment for purposes of radiation in the conventional discharge lamp of the short arc type.

Temperature measurements were taken as follows. Specifically, at a point which is 20 cm away from the anode tip of the discharge lamp to be measured in the direction perpendicular to the longitudinal direction of this discharge lamp, there is an infrared radiation thermometer with an angle of the measurement field of view which is 0.1 mm in diameter. It was provided that the anode tip with the temperature to be measured extends into this angle of the measurement field of view. By measuring the intensity of the infrared radiation (1.35 microns) emitted from the lamp, the result is converted into a temperature.

Each of the discharge lamps of the short arc type in which the temperatures of the anode tips were measured is a high pressure mercury vapor lamp of the short arc type with an output of 1.75 kW. A distance between the electrodes of 4.5 mm. Diameter D of body 7 of the anode is 18 mm.

FIG. 4 shows curve (a) which is the result of measurement of the anode temperature of the conventional discharge lamp and curves (b) and (c) which are the result of measuring the anode temperature of the discharge lamp according to the invention. Here the area in which sintered layers 6 of fine-particle tungsten are formed is at (b) starting from a position with a distance of 0.56 D from anode tip 8, while it is at (c) starting at a position with a distance of 0.33 D from anode tip 8.

As these results of temperature measurements show, in the discharge lamp of the short arc type according to the invention the temperature of anode tip 8 is reduced; this is most effective for suppressing the vaporization of anode 4. In the case of forming sintered layers 6 starting from the position with 0.33 D from anode tip 8 the latter has a temperature which is roughly 120° K lower than in the conventional discharge lamp of the short arc type, in which anode 4 has not been subjected to treatment for purposes of radiation. This means that the amount of tungsten which is vaporized by anode 4 is reduced, by which blackening of the wall of arc tube 2 is suppressed, and by which the degree to which irradiance is maintained is improved.

In a discharge which is formed between cathode 3 and anode 4, the arc comes into direct contact with anode tip 8. Anode tip 8 must therefore be avoided as an area in which sintered layers 6 of the fine-particle tungsten are formed on the outside of anode 4. As experience shows, it is necessary that this area be at least 0.1 D (mm) apart from anode tip 8. Therefore an area with a distance of 0.1 D (mm) from anode tip 8 is called the "vicinity of the anode tip". In this area, formation of sintered layer 6 of fine-particle tungsten in conjunction with the arc discharge is limited.

Furthermore, the results of measurements of the temperatures of the anode tips in FIG. 4 show that, in the case of forming above described sintered layers 6 starting from the position with 0.56 D, the temperature of the anode tip drops only by 40K more than in the conventional lamp in which the anode was not subjected to treatment, while it drops by 120K at 0.33 D, as was described above. To be able to be effectively used for practical purposes, a degree of reduction of the temperature of the anode tip of roughly 100K is necessary. These test results show therefore that the upper limit of the position at which formation of above described sintered layer 6 begins is less than or equal to 0.45 D.

Proceeding from the above described circumstances therefore the area in which sintered layers 6 of fine-particle tungsten are formed was fixed at $0.1 \, D \leq x \leq 0.45 \, D$ on the outside surface of anode 4.

Figure 5:
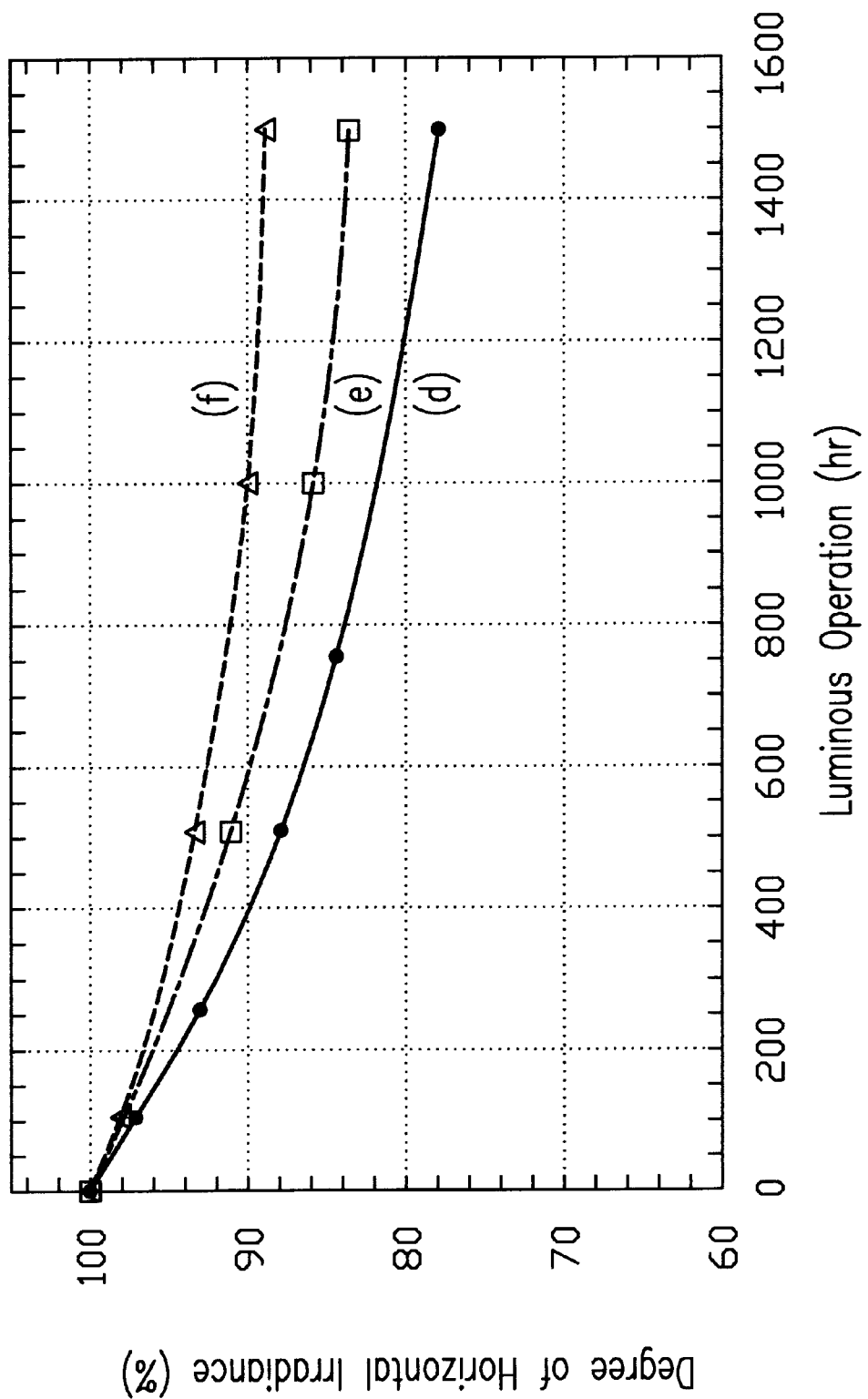
FIG. 5 shows a schematic which reproduces the result of measurements in which the degree to which the horizontal irradiance is maintained in a high pressure mercury vapor lamp of the short arc type used for the invention and in a conventional high pressure mercury vapor lamp of the short arc type was measured.

FIG. 5 is a schematic which reproduces the result of measurements in which the degree was measured to which the horizontal irradiance was maintained in the high pressure mercury vapor lamp of the short arc type used for the invention and in the conventional high pressure mercury vapor lamp of the short arc type, in which anode 4 has not been subjected to treatment for radiation. The lamps used for the measurements are the same as those which were used for the above described measurements of the anode temperature. Here, curve (d) shows the measurement result for a conventional discharge lamp and curves (e) and (f) show the measurement result for the discharge lamp according to the invention. The area in which sintered layers 6 of fine-particle tungsten are formed has the condition of 0.56 D for (e) and 0.33 D for (f).

In the following, the process of measuring the degree to which the horizontal irradiance is maintained is described. Specifically, the high pressure mercury vapor lamp of the discharge type is kept vertical and subjected to luminous operation. At a point which is horizontally apart from the cathode tip with a distance of 50 cm there is a bandpass filter that permits the passage of ultraviolet rays with wavelengths around 365 nm. Directly behind the above described bandpass filter is a detector using a silicon photodiode and with it the irradiance was measured. This shows that, after 1500 hours of luminous operation, the degree to which the horizontal irradiance is maintained in a high pressure mercury vapor lamp of the short arc type according to the invention has been improved by greater than or equal to 10% compared to the conventional lamp in which the anode has not been subjected to treatment.

Furthermore, one feature according to the invention is that production of the lamp compared to the conventional lamp has been simplified, in which to reduce the anode temperature layers of a mixture of tantalum carbide and tungsten are formed on the anode. According to the invention, by sintering fine-particle tungsten on the tungsten anode, sintered bonding of the same materials, i.e., tungsten, with one another takes place. In this way, sintering can be done easily. Furthermore, a strong bond of the sintered layers can be achieved after sintering to the anode as the substrate. Faults such as loosening of the sintered fine tungsten particles in an installation process of the lamp and the like hardly ever occur. Production defects of the lamp are therefore few.

In addition, it is unnecessary to mix the tungsten with carbide, as in the conventional lamp in which formation of layers of the mixture of tantalum carbide and tungsten is done. The final quality of the discharge lamp therefore hardly has any variations which are caused by differences in the mixing ratio of the materials.

A high pressure mercury vapor lamp of the short arc type was described specifically above. However, of course the invention can also be used for a xenon discharge lamp, a xenon-mercury discharge lamp, a discharge lamp in which cadmium, zinc, or the like are encapsulated in the arc tube, or for a metal halide lamp in which at least one metal halide is encapsulated, if the lamp is a discharge lamp of the short arc type.

The material for the anode is not limited to tungsten. In the case of another material with a high melting point, such as molybdenum, tantalum, or the like, the same effect of suppression of vaporization of the anode can be obtained by the sintered layers according to the invention being formed on the outside surface of the anode outside of the vicinity of the tip.

As was described above, in the discharge lamp of the short arc type according to the invention, by sintering the sintered layers of fine-particle tungsten on the outside surface of the anode outside of its tip, on the anode surface fine, concave-convex areas are formed by which the effective surface area of the anode and the thermal radiation are multiplied. The anode temperature therefore drops, and continuation of blackening of the arc tube wall is suppressed. Furthermore, the above described sintered layers can be formed by using tungsten in which the melting point is high for the sintered layers for radiation of the anode into the vicinity of the anode tip where the temperature rises most during luminous operation.

In addition, according to the invention the measure by which no mixture is used for the sintered layers for radiation of the anode obviates the necessity of mixing of the materials, and the production process is simplified accordingly, while in the conventional lamp for reducing the anode temperature the layers of the mixture of tantalum carbide and tungsten were formed on the anode.

It is to be understood that although preferred embodiments of the invention have been described, various other embodiments and variations may occur to those skilled in the art. Any such other embodiments and variations which fall within the scope and spirit of the present invention are intended to be covered by the following claims.

We claim:

1. A short arc discharge lamp comprising:

(a) an arc tube;

(b) an anode positioned within said arc tube, said anode having an outer surface and a tip;

(c) a cathode positioned opposite said anode within said arc tube; and (d) encapsulated emission substances within said arc tube, wherein said outer surface of said anode includes a sintered coating of fine-particle tungsten positioned outside a vicinity of the tip of said anode; and wherein $0.1 \, D \leq x \leq 0.45 \, D$ where x (mm) is a distance between the tip of said anode and a boundary at which said sintered coating of fine-particle tungsten begins and D (mm) is a diameter of said anode.

2. A discharge lamp according to claim 1, wherein Hg and at least one of the rare gases Xe, Ar, Kr, or Ne are encapsulated within said arc tube.

* * * * *